(12) United States Patent
Suzuki

(10) Patent No.: US 6,232,638 B1
(45) Date of Patent: May 15, 2001

(54) SEMICONDUCTOR DEVICE AND MANUFACTURING METHOD FOR SAME

(75) Inventor: Hisamitsu Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/199,459

(22) Filed: Nov. 25, 1998

(30) Foreign Application Priority Data

Nov. 28, 1997 (JP) .................................................... 9-327936

(51) Int. Cl.⁷ ................................................ H01L 27/102
(52) U.S. Cl. ........................................... 257/370; 257/378
(58) Field of Search .................................. 257/146, 197, 257/378, 370

(56) References Cited

U.S. PATENT DOCUMENTS

| | | |
|---|---|---|
| 5,149,663 * | 9/1992 | Chai et al. .............................. 437/31 |
| 5,158,900 | 10/1992 | Lau et al. . |
| 5,334,549 | 8/1994 | Eklund . |
| 5,348,896 | 9/1994 | Jang et al. . |
| 5,387,552 | 2/1995 | Iranmanesh . |
| 5,936,284 * | 8/1999 | Ravanelli ............................. 257/361 |

FOREIGN PATENT DOCUMENTS 5-283623    10/1993 (JP) .

OTHER PUBLICATIONS

Chyan, et al., "A Very Performance, Epi–Free, and Manufacturable 3.3 V 0.35 um BiCMOS Technology for Wireless Applications" 1997 Symposium on VLSI Technology digest of technical papers dated Jun. 10–12, 1997/Kyoto pp. 35–36.

* cited by examiner

Primary Examiner—George Fourson
Assistant Examiner—Thanh V Pham
(74) Attorney, Agent, or Firm—McGinn & Gibb, PLLC

(57) ABSTRACT

In a BiCMOS structure, a bipolar transistor is formed inside a the ring of a ring-shaped structure that is made of the same material as the gate electrode, and an insulation film that provides insulation between an emitter electrode and a p-type intrinsic base region is used only inside the ring-shaped structure, so that the insulation film that makes up the side wall insulation film of the CMOS transistor and the insulation film that provides insulation between the bipolar transistor emitter electrode and p-type intrinsic base region are different films.

7 Claims, 14 Drawing Sheets

101 SILICON SUBSTRATE
105 FIRST N-TYPE WELL REGION
109 P-TYPE BASE REGION
114 EMITTER ELECTRODE
115 UPPER ELECTRODE
120 LOWER ELECTRODE
121 RING-SHAPED STRUCTURE
130 SILICIDE LAYER

Fig. 1
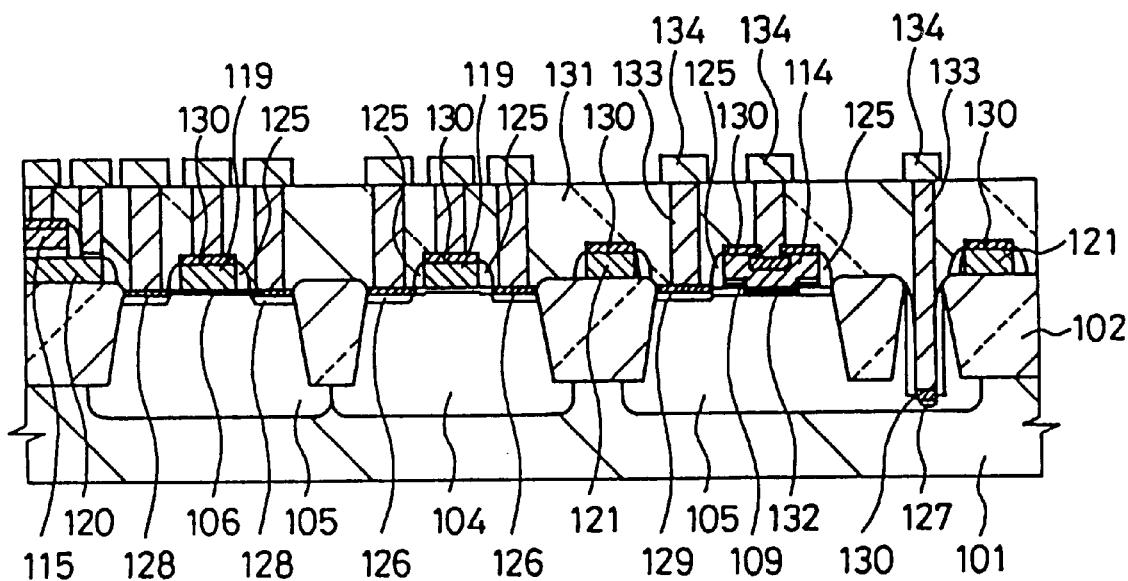
1 0 1 SILICON SUBSTRATE
1 0 5 FIRST N-TYPE WELL REGION
1 0 9 P-TYPE BASE REGION
1 1 4 EMITTER ELECTRODE
1 1 5 UPPER ELECTRODE
1 2 0 LOWER ELECTRODE
1 2 1 RING-SHAPED STRUCTURE
1 3 0 SILICIDE LAYER

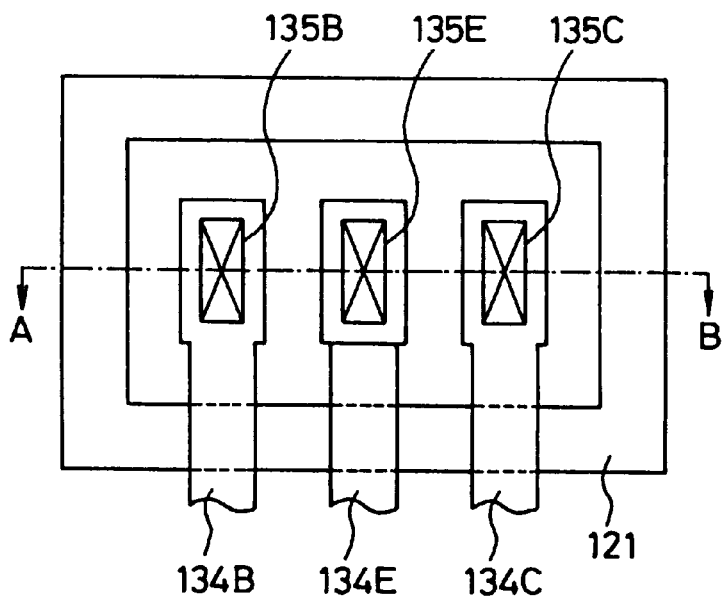
Fig. 2(a)
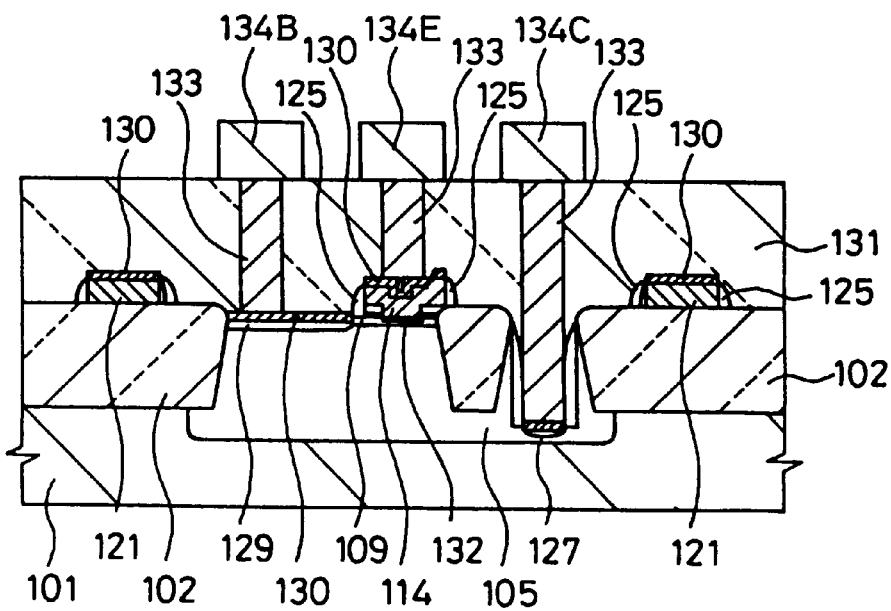
Fig. 2(b)

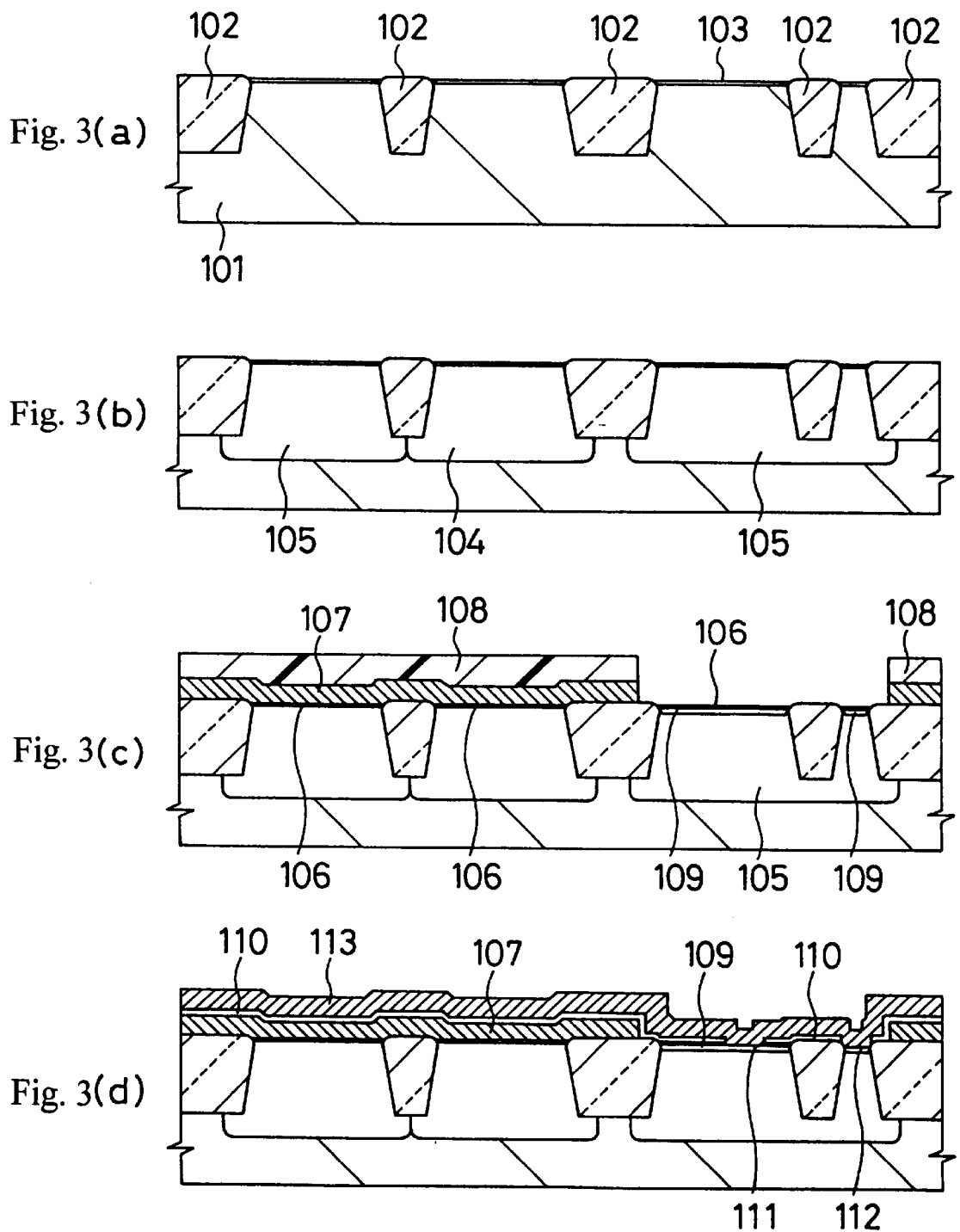

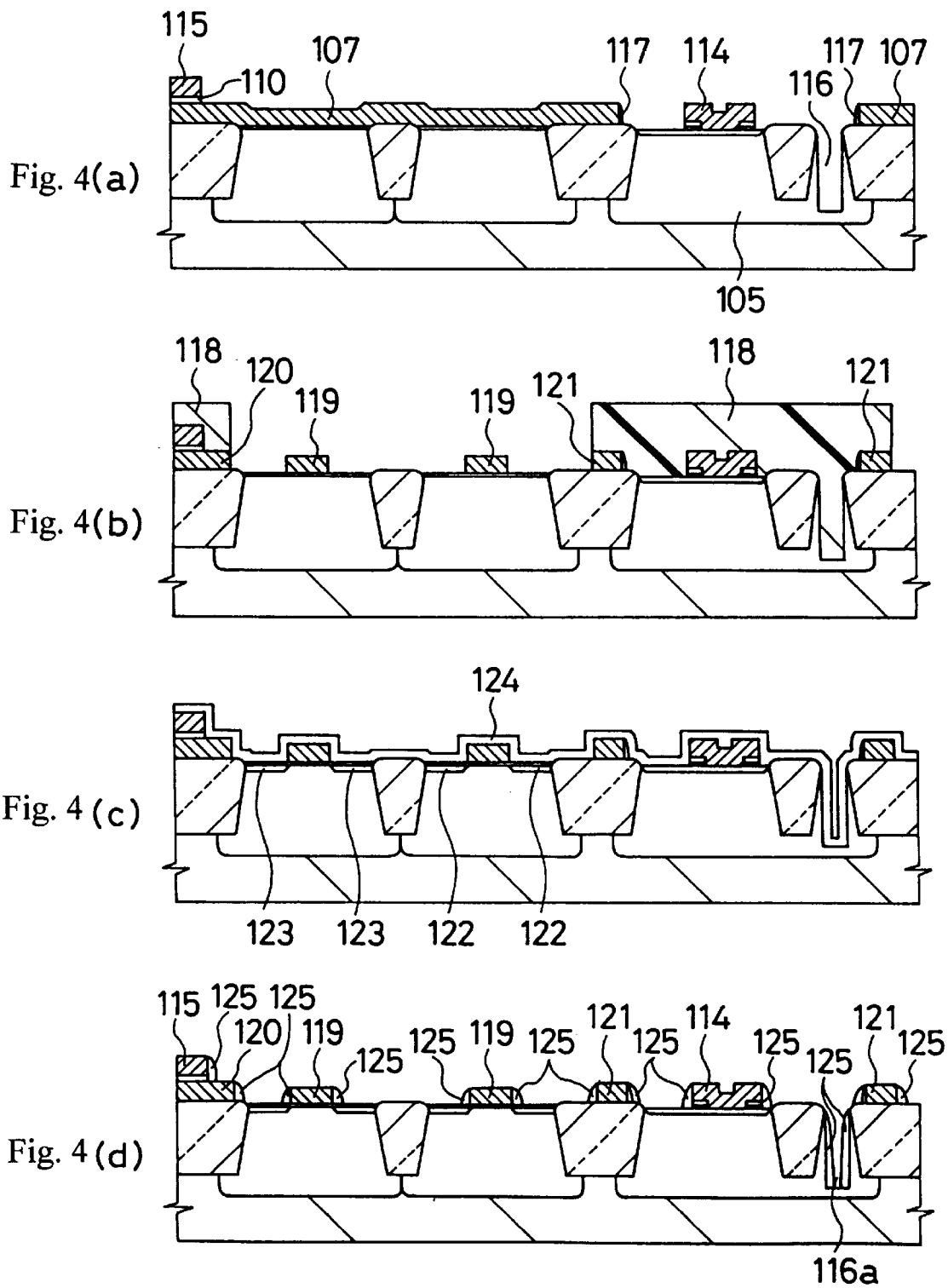

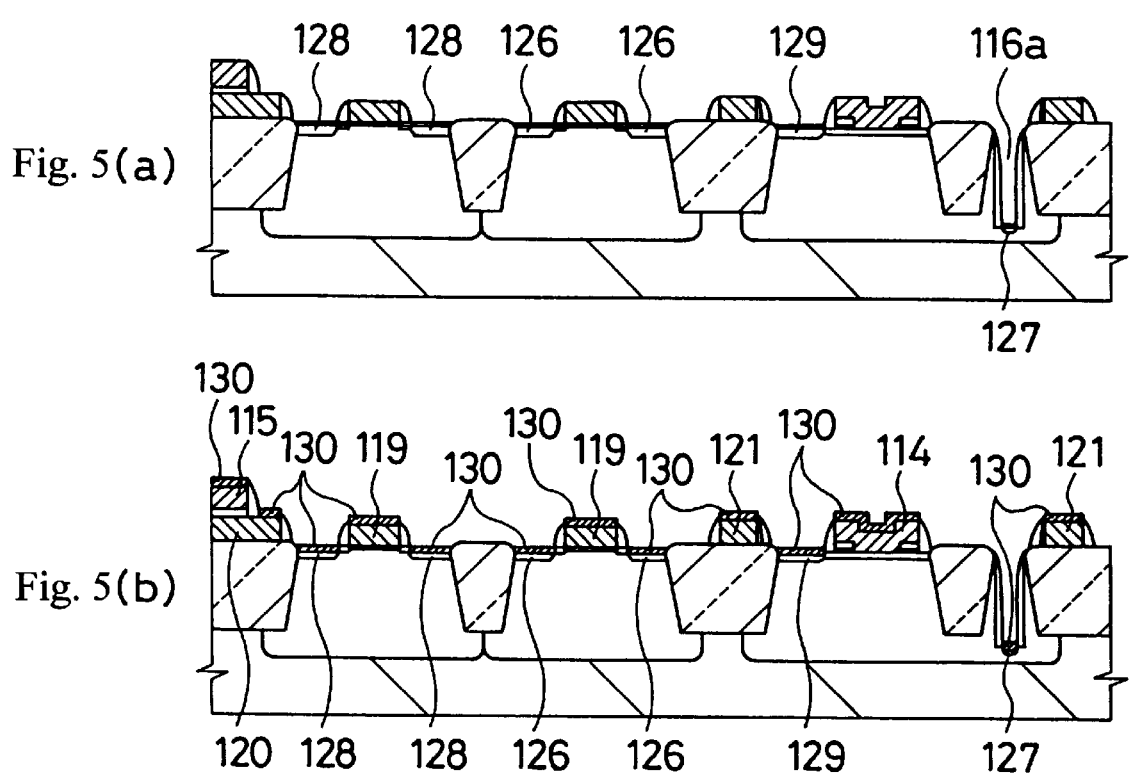

Fig. 6(a)
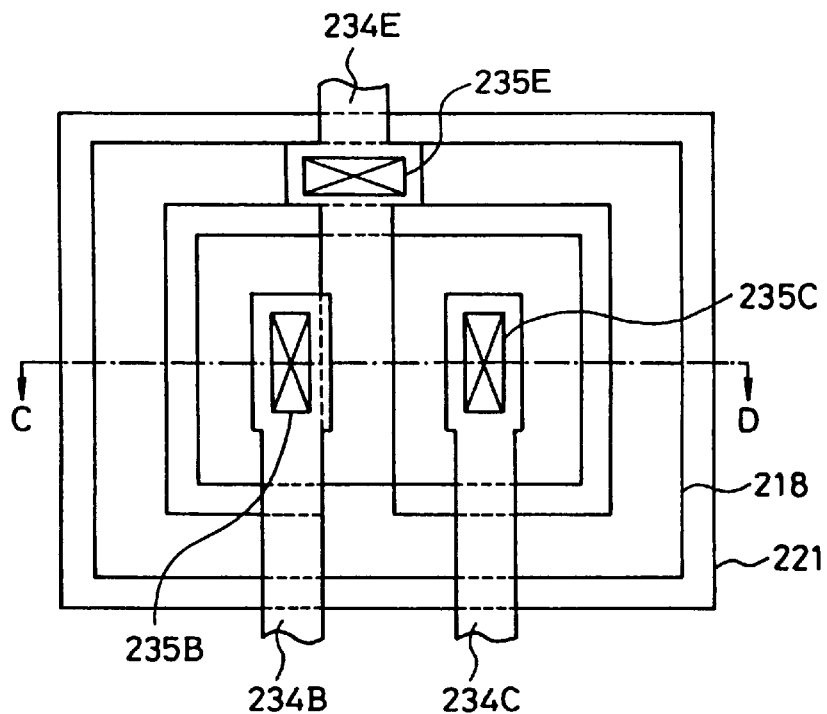
Fig. 6(b)
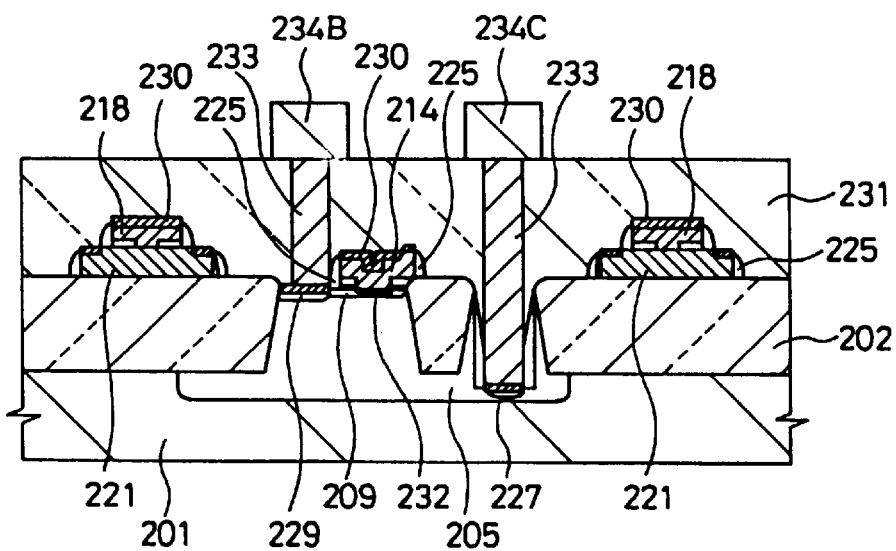

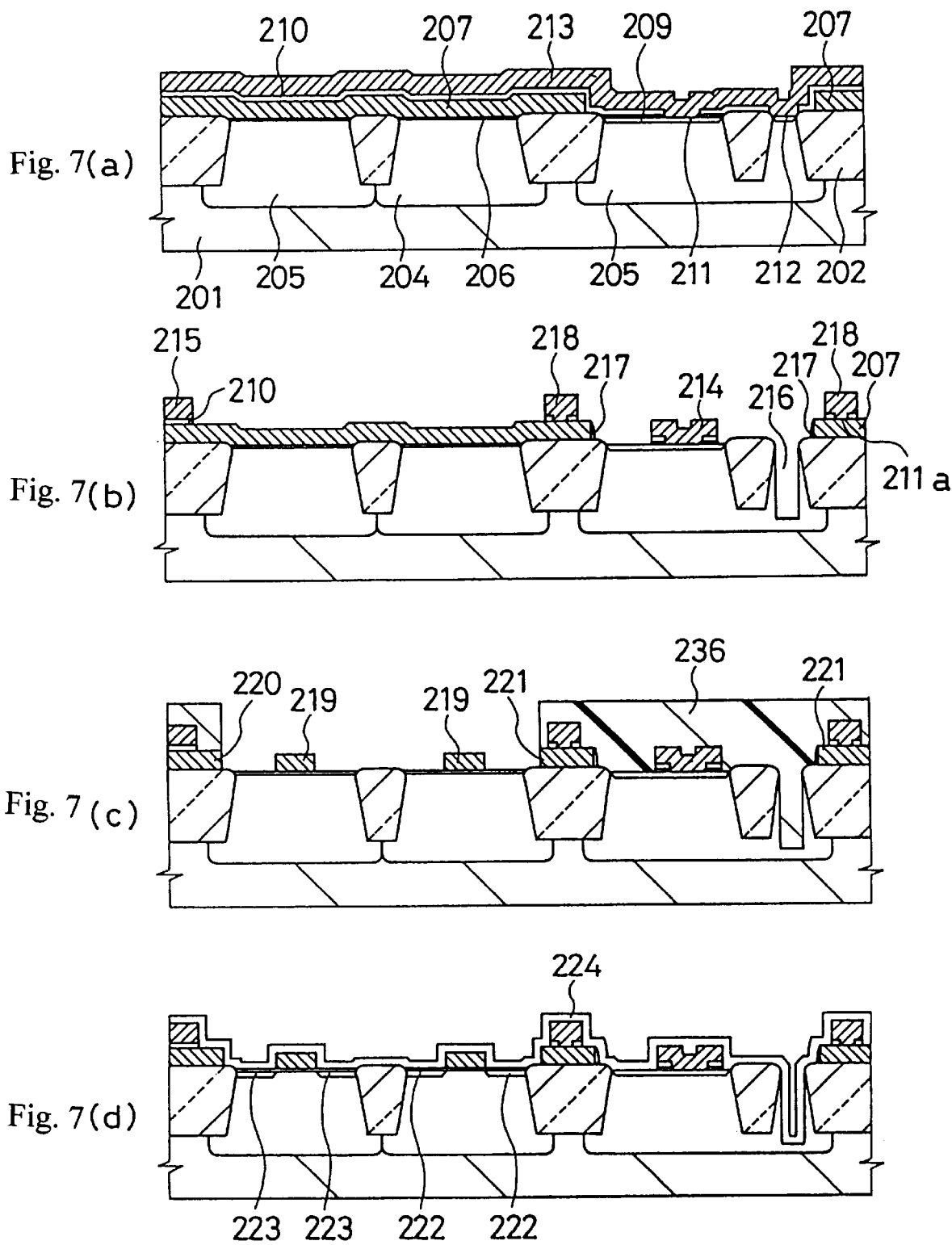

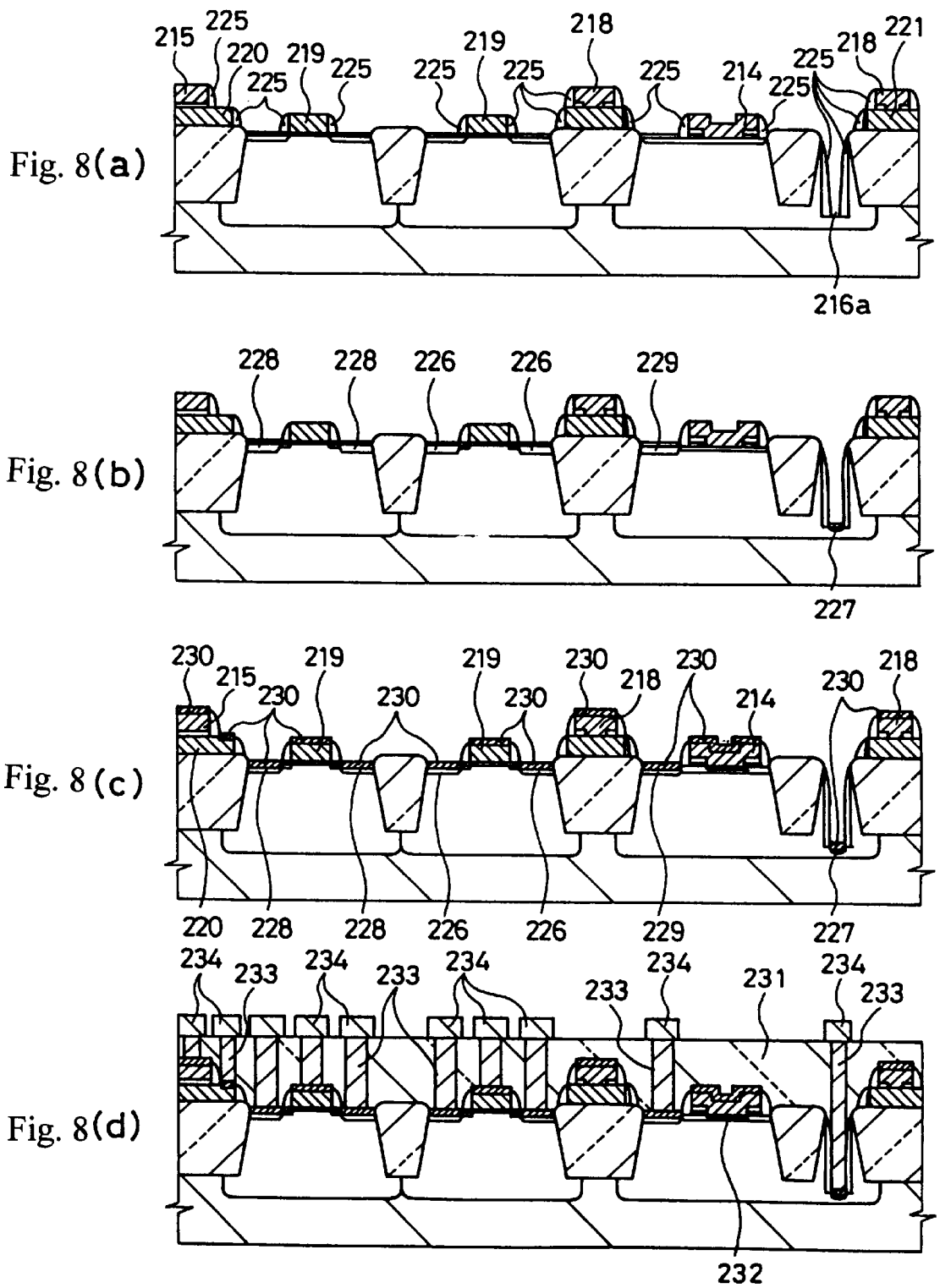

Fig. 9(a)
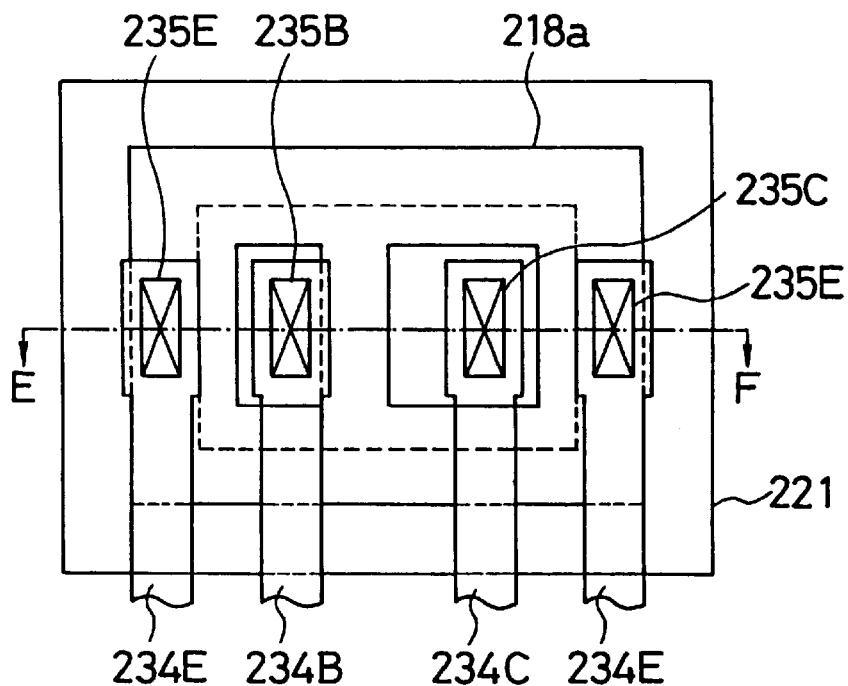
Fig. 9(b)
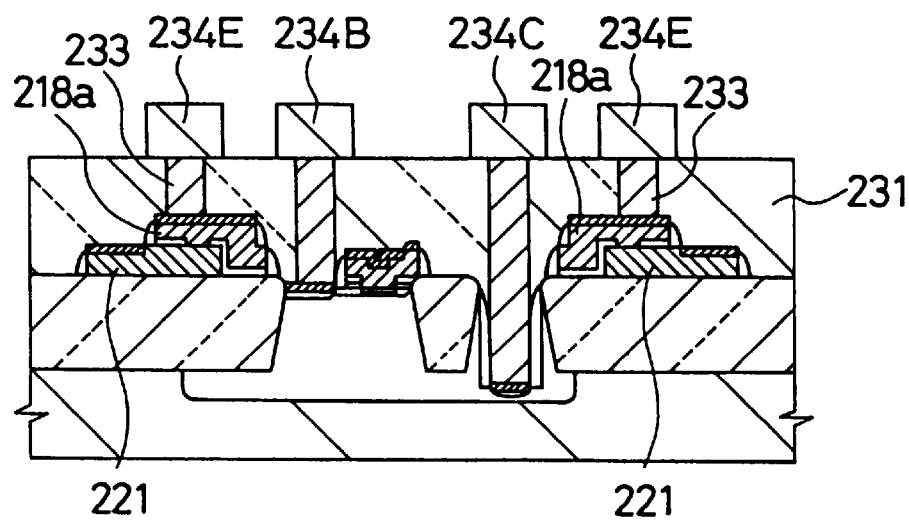

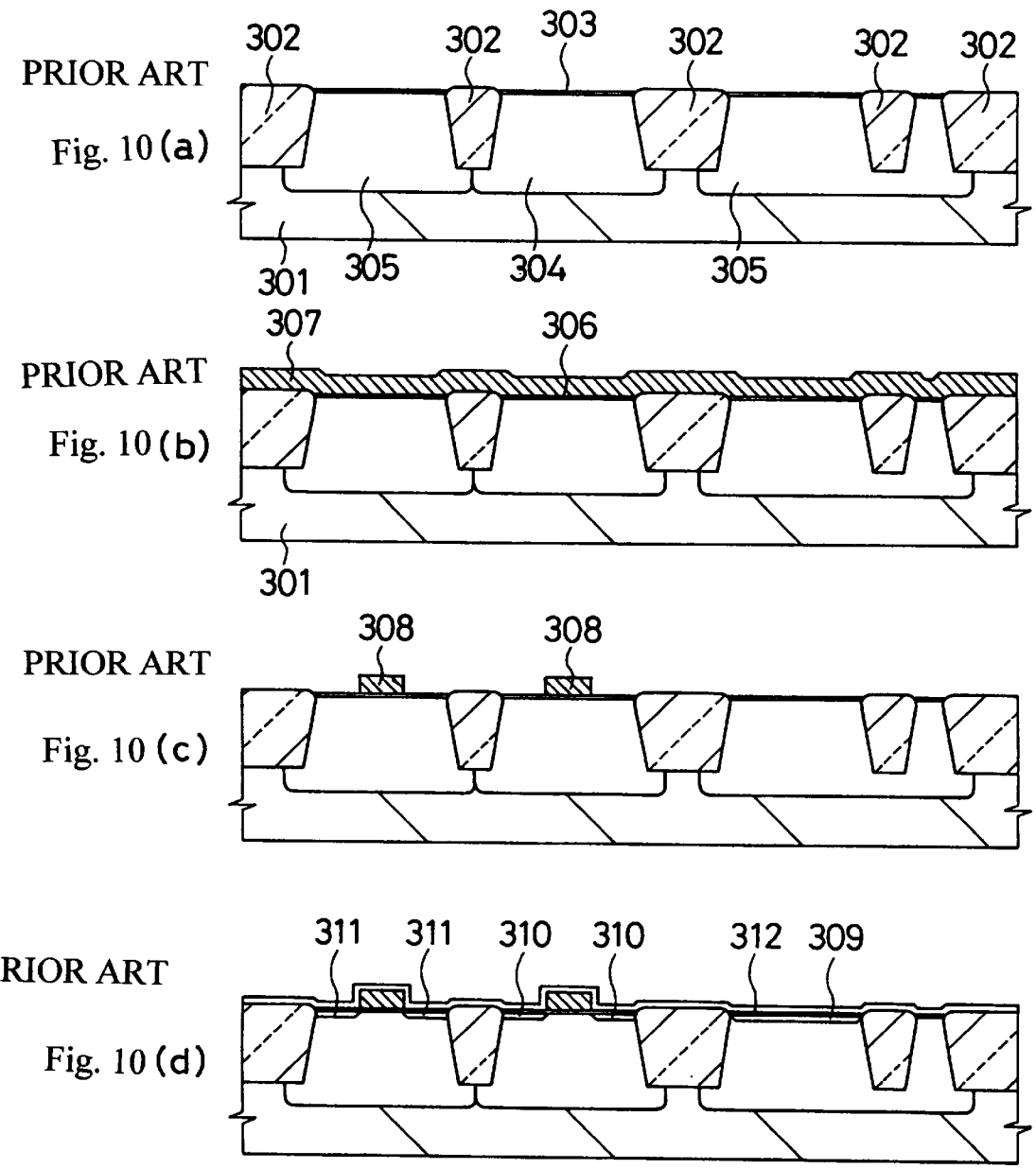

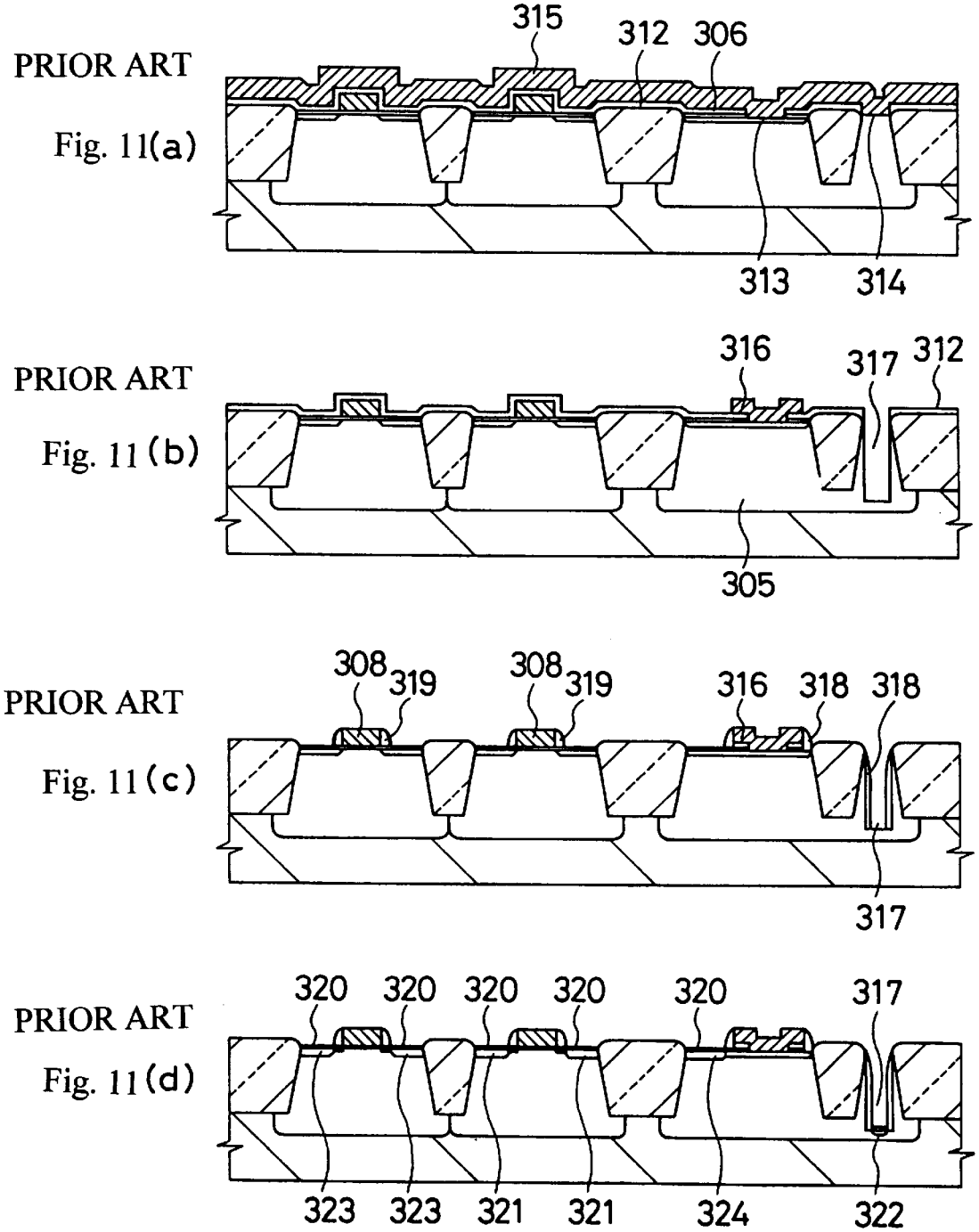

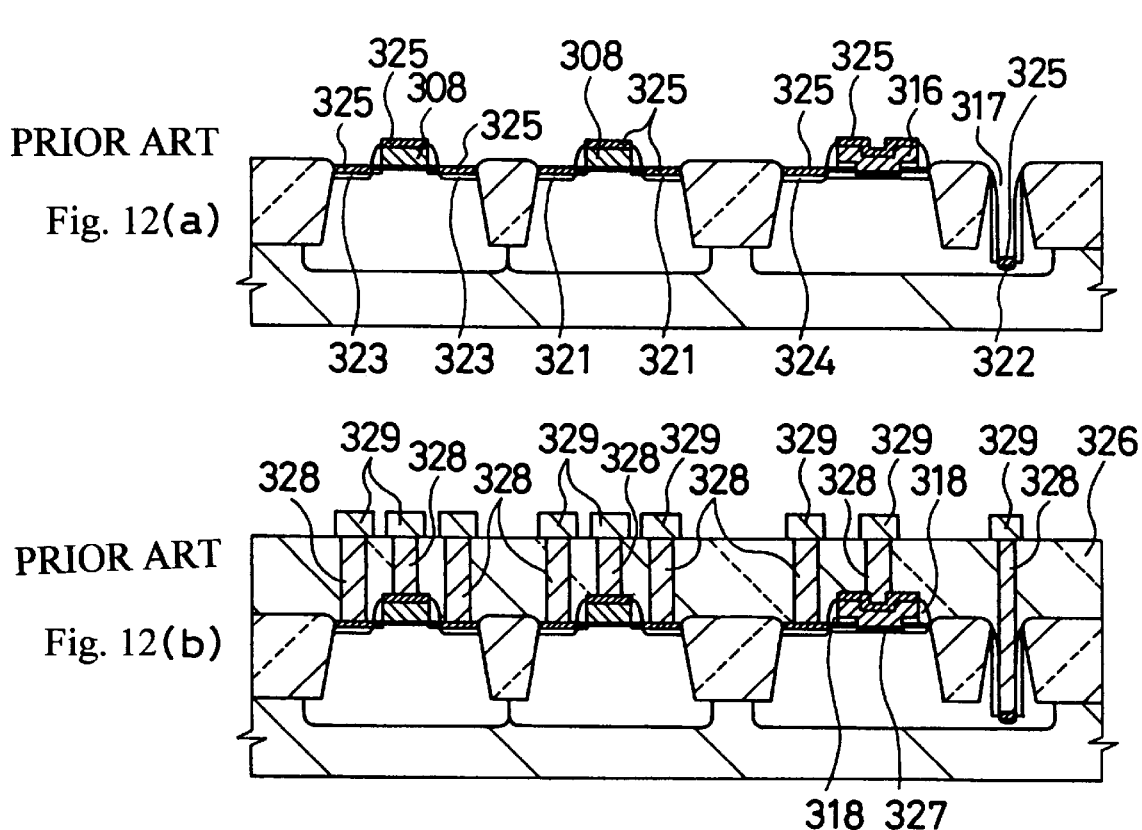
PRIOR ART
Fig. 12(a)
PRIOR ART
Fig. 12(b)

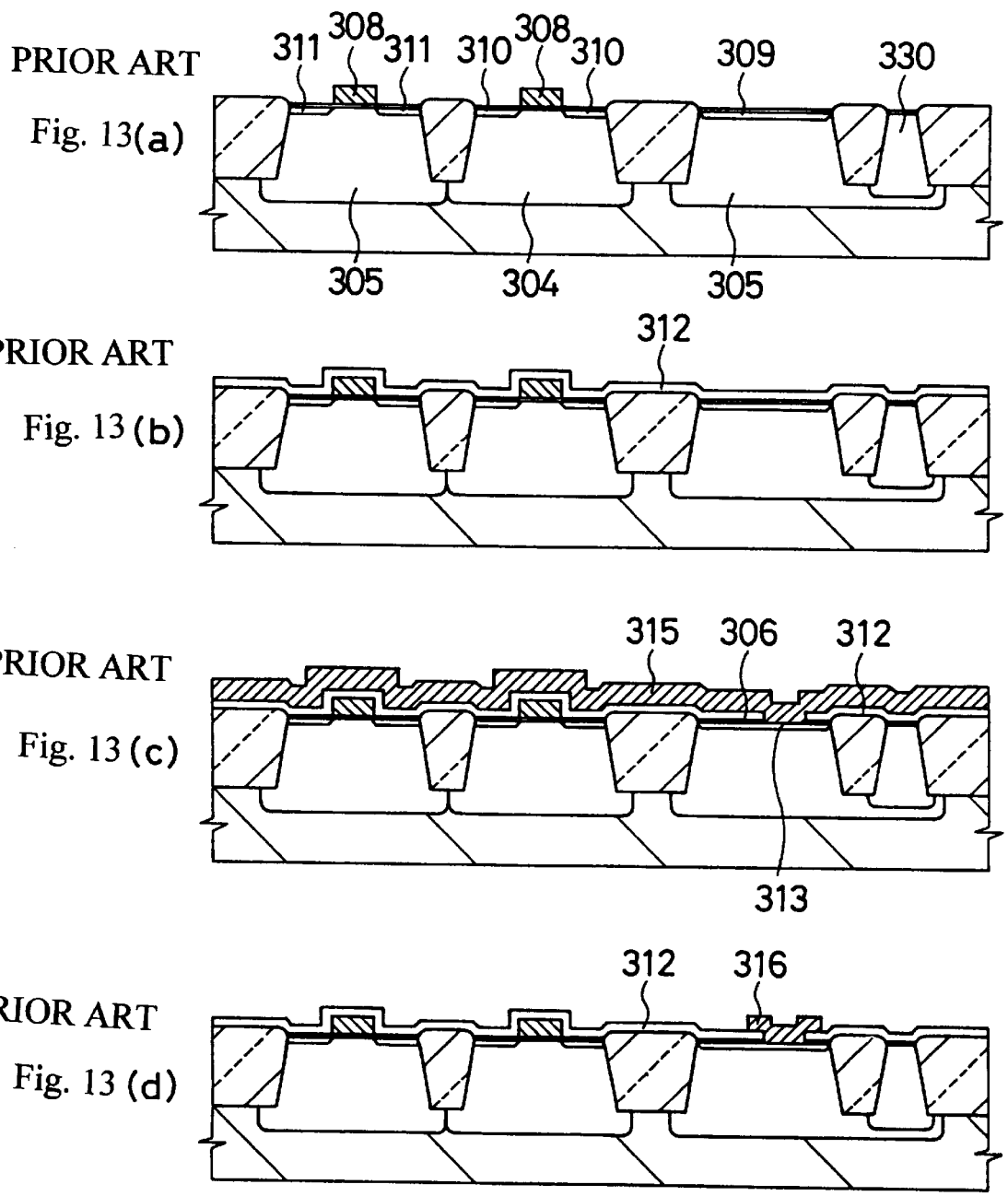

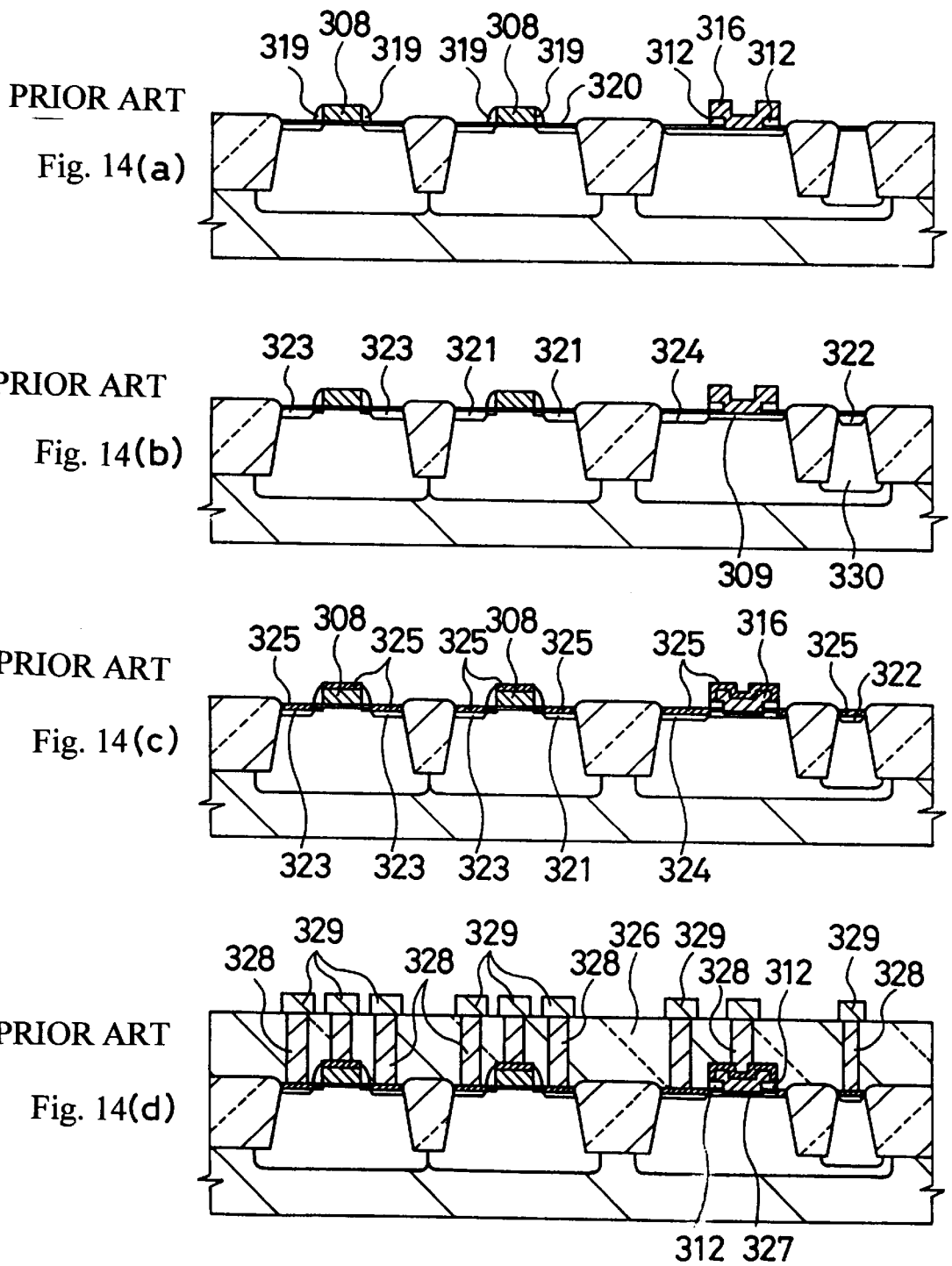
PRIOR ART
Fig. 14(a)
PRIOR ART
Fig. 14(b)
PRIOR ART
Fig. 14(c)
PRIOR ART
Fig. 14(d)

SEMICONDUCTOR DEVICE AND MANUFACTURING METHOD FOR SAME

BACKGROUND OF THE INVENTION

1. Field of the Invention

The present invention relates to a semiconductor device that has both a bipolar transistor and a complementary-type field-effect transistor (hereinafter referred to as a CMOS transistor) formed on a semiconductor substrate, and to a method of manufacturing such as semiconductor device.

2. Background of the Invention

A technology in which the high operating speed and high drive capability of a bipolar transistor are combined with the low power consumption of a CMOS transistor, these being formed on one and the same substrate, is a known technology, referred to hereinafter as BiCMOS, and in recent years this has come to be a most effective means of meeting demands for low power consumption and high speed.

The prior art in this field will be described in terms of the structure of and manufacturing method for BiCMOS devices of recent years, reference being made to drawings FIG. 10 through FIG. 12. This technology, described below, will be referred to as the first prior art, the cross-sectional views in FIG. 10 through FIG. 12 illustrating the sequence of manufacturing process steps for such as BiCMOS device. The description that follows will also include the structure of a BiCMOS device.

As shown in FIG. 10(a), an isolation oxide film 302, and a first oxide film 303 are formed on the surface of a p-type silicon substrate 301, using a known LOCOS isolation method, a trench isolation method, or the like. Next, using boron ion implantation and heat treating, a first p-type well region 304 is formed in an n-channel MOS (NMOS) transistor forming region, and by phosphorus ion implantation and heat treating, a first n-type well region 305 is formed in a p-channel MOS (PMOS) transistor forming region and bipolar transistor collection region.

Next, as shown in FIG. 10(b), a gate oxide film 306 is formed on the surface of the silicon substrate 301, and a first polysilicon 307 is grown. Then, as shown in FIG. 10(c), using photoresist or the like, a gate electrode 308 is formed, using a known anisotropic etching method. Then, as shown in FIG. 10(d), boron ion implantation is used to form a p-type intrinsic base region 309, after which ion implantation is done with photoresist or the like as a mask, so as to form an n-type LDD layer 310 and p-type LDD layer 311, and formed a second oxide film 312 on the surface of the silicon substrate 301.

Next, as shown in FIG. 11(a), using photoresist or the like as a mask, a known etching technology is used to selectively remove the gate oxide film 306 and the second oxide film 312, forming an emitter contact 313 and a collector contact 314, a second polysilicon 315 being deposited as either a non-doped layer or as a layer doped with a dopant such as phosphor or arsenic.

Next, as shown in FIG. 11(b), using photoresist or the like as a mask, a known anisotropic etching method is used to form an emitter electrode 316, after which, using the above-noted photoresist mask and the second oxide film 312 as a mask forming a collector trench, etching is performed under the same etching conditions or in a plurality of steps, so as to etch the first n-type well region 305, and form the collector trench 317.

Next, as shown in FIG. 11(c), after depositing a third oxide film 318, a known anisotropic dry etching, that is, etch back, is used to form on each of the side walls of the emitter electrode 316 and collector trench 317 a side wall insulation film that is formed by an oxide film 318, and form a side wall insulation film 319 that is formed as a laminate of the second oxide film 312 and the third oxide film 318 on the side wall of the gate electrode 308.

Next, as shown in FIG. 11(d), masking is done with photoresist or the like and a thin intervening oxide film 320 for ion implantation of a dopant such as phosphorus or arsenic, thereby forming on the NMOS n+ type source/drain 321 and on the bottom of the collector trench 317 an n+ type diffusion layer 322, after which photoresist or the like is used as a mask for ion implantation of a dopant such as boron or $BF_2$, thereby forming the PMOS p+type source/drain 323 and p+ type extrinsic base 324.

In the case of forming the above-noted second polysilicon 315 that forms the emitter electrode 316 by using a non-doped deposition, the introduction of a dopant into the emitter electrode 316 can also be done when forming the NMOS n+ type source/drain 321 by using ion implantation of phosphorus, arsenic or the like, and can also be done in a separately added process step in which phosphorus, arsenic or the like is introduced.

Next, as shown in FIG. 12(a), a known method is used with a metal such as titanium, cobalt, or nickel, to suicide the surfaces of the gate electrode 308, the emitter electrode 316, n+ type diffusion layer 322 on the bottom of the collector trench 317, the n+ type source/drain 321 and p+ type source/drain 323 and the p+ type extrinsic base 324, forming the silicide layer 325.

Next, as shown in FIG. 12(b), an interlayer insulation film 326 made of a BPSG (boron-phosphorus-silicate-glass) film is formed and RTA (rapid thermal annealing) to form an emitter diffusion layer 327, after which a contact hole is made, and a contact plug 328 is formed on an intervening barrier metal (not shown in the drawing), after which the metal wires 329 are formed.

Next, the BICMOS structure and associated method of manufacture that is noted in the Digest of Technical Papers, pp. 35–36, which is a pre-print of the IEEE 1997 Symposium on VLSI Technology, will be described, with reference being made to FIG. 13 and FIG. 14. This technology, to be described below, will be referred to as the second prior art. FIG. 13 and FIG. 14 are cross-sectional views that show the sequence of manufacturing process steps for this BiCMOS structure. This will be described in terms of the same type of manufacturing processes as noted for the first prior art. Because of this relationship, items that are the same as in the first prior art are assigned the same reference numerals.

In this case, the process steps up until that shown in FIG. 10(c) for the first prior art are the same. As shown in FIG. 13(a), a mask of photoresist or the like is used with a known anisotropic etching method to form a gate electrode 308. Then, ion implantation of boron or $BF_2$ and heat treating is done to form a p-type intrinsic base region 309 onto the surface of the first n-type well region 305. Next, using a mask of photoresist or the like, ion implantation is done to form an n-type LDD layer 310 on the surface of the first p-type well region 304, and a p-type LDD layer 311 on the surface of the first n-type well region 305. Ion implantation is then done of, for example, phosphorus, with an energy of 70 keV and a dose of $1\times10^{15}$ to $3\times10^{16}$ cm$^{-2}$ thereby forming a collector extension region 330.

Next, as shown in FIG. 13(b), a second oxide film 312 having a thick film thickness is deposited over the entire surface. Then, as shown in FIG. 13(c), a mask of photoresist or the like is used to perform etching by a known method, so as to selectively remove the gate oxide film 306 and the second oxide film 312, forming the emitter contact 313. A second polysilicon 315 of 150 to 400 nm is deposited as either a nondoped layer or as a layer doped with phosphorus, arsenic or the like with a dose of $1\times10^{18}$ to $1\times10^{21}$ $cm^{-2}$.

Next, as shown in FIG. 13(d), a mask of photoresist or the like is used to perform anisotropic etching by a known method, thereby forming an emitter electrode 316. Then, as shown in FIG. 14(a), the second oxide film 312 is entirely removed, except for the part directly below the emitter electrode 316 and side wall insulation film 319 that is to be left remaining on the side wall of the gate electrode 308. Then a thin oxide film 320 of approximately 5 to 20 nm is formed.

Next, as shown in FIG. 14(b), using a mask of photoresist or the like, ion implantation of phosphorus, arsenic or the like is done so as to form an NMOS n+ type source/drain 321 and a n+ type diffusion layer 322 on the top of the collector extension region 330, after which a mask of photoresist or the like is used to perform ion implantation of boron or $BF_2$, or the like, thereby forming a PMOS p+ type source/drain. 323 and a p+ type extrinsic base 324.

Next, as shown in FIG. 14(c), the surfaces of the gate electrode 308, the emitter electrode 316, the n+ type diffusion layer 322, the n+ type source/drain 321, the p+ type source/drain 323, and the p+ type extrinsic base 324 are silicided to form a silicide layer 325.

Next, as shown in FIG. 14(d), an interlayer insulation film that is formed by an oxide film of, for example, 50 nm (TEOS-$SiO_2$ film) and an 800 nm BFSG film is formed, and RTA is performed to form an emitter diffusion layer 327, after which a contact hole is made, and a contact plug 328 is formed on an intervening barrier metal (not shown in the drawing), after which the metal wires 329 are formed.

In a BiCMOS transistor according to the first and second prior art cited herein, the insulation between the bipolar transistor emitter electrode 316 end and the p+ type intrinsic base region 309 is provided by the gate oxide film 306 and second oxide film 312. This second oxide film 312 makes up a side wall insulation film 319 on the side wall of the CMOS gate electrode 308.

In general, effective means of improving the performance of a CMOS transistor include making the gate electrode channel width extremely narrow, making the gate oxide film thin, or making the width of the side wall insulation film narrow. In a BiCMOS transistor according to the prior art, therefore, to achieve an improvement in the performance of the CMOS part thereof, there was the method as noted above of, for example, making the CMOS side wall insulation film 319 narrow. If this method is used, however, the film thickness of the second oxide film 312 also becomes thin, this leading to a lowering of the breakdown voltage provided by the separation provided by the above-noted insulation film between the emitter electrode end and p+ type intrinsic base region 309.

Additionally, as shown in FIG. 11(a) and FIG. 13(c), after formation of an emitter contact 313, when the second polysilicon 315 is grown, in order to provide a reliable connection of the second polysilicon 315 and the p-type intrinsic base region 309, it is necessary to, for example, provide surface cleaning of the p-type intrinsic base region within the emitter contact, and when surface cleaning is done the second oxide film that forms the CMOS side wall insulation film 319 is etched, this resulting in variations in the film thickness which manifest themselves as variations in the performance of the CMOS device.

Accordingly, an object of the present invention is to provide an insulation film that makes up the CMOS side wall insulation film and an insulation film that provides insulation between the bipolar transistor emitter electrode and p-type intrinsic base region separately, to prevent a lowering of the breakdown voltage between the emitter electrode and p+ type intrinsic base region, and to prevent an increase in the emitter resistance caused by an increase in the wire resistance of the emitter electrode that can occur when the bipolar transistor is made small.

SUMMARY OF THE INVENTION

A semiconductor device according to the present invention is a semiconductor device having a bipolar transistor and MOS transistors on a semiconductor substrate, said bipolar transistor having an emitter electrode at the emitter portion thereof, wherein a side wall of said gate electrode and a side wall of said emitter electrode are formed of one and the same insulating film.

In the semiconductor device according to the present invention, a ring-shaped structure is formed so as to surround said bipolar transistor.

Another aspect of the present invention is that a silicide layer is formed on the surfaces of source/drain diffusion region, and said gate electrode of said MOS transistor, said emitter electrode, and an emitter electrode outer periphery part formed on said ring-shaped structure, and said emitter electrode outer periphery part on said ring shaped structure is connected to said emitter electrode.

A method of manufacturing a semiconductor device according to the present invention is a method of manufacturing a semiconductor device having a bipolar transistor and MOS transistors on a semiconductor substrate, said bipolar transistor having an emitter electrode at the emitter portion thereof, wherein a gate electrode of said MOS transistor being formed by patterning of a first conductive film, and an emitter electrode of said bipolar transistor being formed by patterning of a second conductive film.

A method of manufacturing a semiconductor device according to the present invention is a method of manufacturing a semiconductor device having a bipolar transistor and MOS transistors on a semiconductor substrate, said bipolar transistor having an emitter electrode, wherein said method comprising steps of: forming an isolation oxide film 102 on said semiconductor substrate; forming a well region of one conductivity for said MOS transistor, a well region of the opposite conductivity for said MOS transistor, and a collector region of the one conductivity for said a bipolar transistor; forming a first insulation film 106 and first conductive film 107, in this sequence, on the surfaces of said well regions and said collector region; removing said first conductive film 107 in a region on which said bipolar transistor will be formed, thereby exposing said first insulation film 106, and forming a intrinsic base region 109 of said opposite conductivity; forming a second insulation film 110 over the entire surface; forming a first emitter contact 111 by etching said first insulation film 106 and said second insulation film 110 on said intrinsic base region 109; forming a second conductive film 113 over the entire surface; forming an emitter electrode 114 by etching said second conductive film 113; forming a gate electrode 119 of said MOS transistor and a ring-shaped structure 121 around the periphery of said bipolar transistor by etching said first conductive film 107; forming a third insulation film 124 over the entire surface; and forming a side wall insulation film 125 on the side of said gate electrode 119, emitter electrode 114 and ring-shaped structure 121, by etching back said third insulation film 124.

Another aspect of a method of the present invention is a method of manufacturing a semiconductor device having a bipolar transistor and MOS transistors on a semiconductor substrate, said bipolar transistor having an emitter electrode, wherein said method comprising steps of: forming an isolation oxide film 202 on said semiconductor substrate; forming a well region of one conductivity for said MOS transistor, a well region of the opposite conductivity for said MOS transistor, and a collector region of the one conductivity for said a bipolar transistor; forming a first insulation film 206 and first conductive film 207, in this sequence, on the surfaces of said well regions and said collector region; removing said first conductive film 207 in a region of said a bipolar transistor, thereby exposing said first insulation film 206, and forming a intrinsic base region of said opposite conductivity; forming a second insulation film 210 over the entire surface; forming a first emitter contact 211 on said first insulation film 206 and said second insulation film 210 on said intrinsic base region, and forming a second emitter contact 211a on said second insulation film 210 on said first insulation film 207; forming a second conductive film 213 over the entire surface; forming an emitter electrode 214 and emitter electrode peripheral part 218 by etching said second conductive film 213; forming a gate electrode 219 of MOS transistor and a ring-shaped structure 207 around the periphery of said bipolar transistor by etching said first conductive film 207, forming a third insulation film 224 over the entire surface; and forming a side wall insulation film 225 on the side of said gate electrode 219, emitter electrode 214, emitter electrode outer periphery part 218 and ring-shaped structure 207, by etching back said third insulation film 224.

Another aspect of a method of the present invention is an etched trench being formed in a collector region of said bipolar transistor when forming said emitter electrode.

Another aspect of a method of the present invention is etching of said second conductive film being done to form an upper capacitance electrode simultaneously with the forming of said emitter electrode, and etching of said first conductive film being done to form an lower capacitance electrode simultaneously with the forming of said gate electrode and ring-shaped structure.

Another aspect of a method of the present invention is an upper capacitance electrode being formed simultaneously with the forming of said emitter electrode, and a lower capacitance electrode being formed simultaneously with the forming of said gate electrode and said ring-shaped structure.

In the present invention, a ringshaped structure formed from the same conductive film as the gate electrode of the MOS transistor is disposed in a ring shape around the periphery of the bipolar transistor region. The insulation film that provides insulation between the emitter electrode of the bipolar transistor within the ring-shaped structure and the p-type intrinsic base region, and the insulation film that makes up the side wall of the CMOS transistor gate electrode and bipolar transistor emitter electrode side wall insulation are different insulation films.

Additionally, part of the emitter electrode, that is, the outer periphery thereof, is formed in a ring-shape over the ring-shaped structure, a mutual contact being achieved by using an emitter contact, making it possible to prevent an increase in the resistance of the wiring part of the emitter resistance.

DESCRIPTION OF THE DRAWINGS

FIG. 1 is a cross-sectional view that illustrates a BiCMOS structure according to the first embodiment of the present invention.

FIG. 2 is a plan view and a cross-sectional view that illustrate the structure of the bipolar transistor part of a BiCMOS according to the first embodiment of the present invention.

FIG. 3 is cross-sectional view that shows the manufacturing process step sequence in the first embodiment of the present invention.

FIG. 4 is cross-sectional view that shows the manufacturing process step sequence in the first embodiment of the present invention.

FIG. 5 is cross-sectional view that shows the manufacturing process step sequence in the first embodiment of the present invention.

FIG. 6 is a plan view and a cross-sectional view that illustrate the structure of the bipolar transistor part of a BiCMOS according to the second embodiment of the present invention.

FIG. 7 is cross-sectional view that shows the manufacturing process step sequence in the second embodiment of the present invention.

FIG. 8 is cross-sectional view that shows the manufacturing process step sequence in the second embodiment of the present invention.

FIG. 9 is plan view and a cross-sectional view that illustrate the structure of the bipolar transistor part of a BiCMOS according to the third embodiment of the present invention.

FIG. 10 is a cross-sectional view that illustrates the BiCMOS manufacturing process step sequence in the first prior art.

FIG. 11 is a cross-sectional view that illustrates the BiCMOS manufacturing process step sequence in the first prior art.

FIG. 12 is a cross-sectional view that illustrates the BiCMOS manufacturing process step sequence in the first prior art.

FIG. 13 is a cross-sectional view that illustrates the BiCMOS manufacturing process step sequence in the second prior art.

FIG. 14 is a cross-sectional view that illustrates the BiCMOS manufacturing process step sequence in the second prior art.

DESCRIPTION OF THE PREFERRED EMBODIMENTS

Preferred embodiment of the present invention are described in detail below, with reference being made to the relevant accompanying drawings. The first embodiment of the present invention is described below, with reference being made to FIG., 1 and FIG. 2. FIG. 1 is a cross-sectional view of a BiCMOS, and FIG. 2 is a plan view and cross-sectional view that illustrate the bipolar transistor part of this BiCMOS. FIG. 2(b) is a cross-section as seen along the cutting line A–B that is shown in FIG. 2(a).

The cross-sectional structure of a bipolar transistor according to the first embodiment of the present invention, as shown in FIG. 1 and FIG. 2, has a first n-type well region 105 that is surrounded by an isolation oxide film 102 on a silicon substrate 101, a intrinsic base region that is formed by a p-type intrinsic base region 109 and a p+ type extrinsic base 129 being formed within the first n-type well region 105, this intrinsic base region and a contact plug 133 that is formed on the n+ type diffusion layer 127 of the collector region being separated by means of the element separation oxide film 102 that is formed on the surface of the first n-type well region 105, and an emitter diffusion layer 132 being formed within the p-type intrinsic base region 109. The emitter electrode 114 is connected to the emitter diffusion layer 132, and a side wall insulation film 125 is formed on the side wall of the emitter electrode 114.

On the peripheral part of the side wall insulation film 125 of the emitter electrode 114 is a p+ type extrinsic base 129, this being formed simultaneously with the formation of the CMOS p+ type source/drain 128. Additionally, a silicide layer 130 is formed on the surfaces of the n+ type diffusion layer 127, the p+ type extrinsic base 129, and the emitter electrode 114.

A feature of the present invention is the formation of a ring-shaped structure 121 on top of the isolation oxide film 102, so as to surround the bipolar transistor as noted above. A silicide layer 130 is formed over this ring-shaped structure 121 as well.

In the plan view of the bipolar transistor of the first embodiment of the present invention, presented in FIG. 2(a), the metal wire 134E for the emitter electrode is connected to the silicide layer 130 on the emitter electrode 114 via the emitter electrode contact 135E. In the same manner, the metal wire 1348 for the base electrode and the metal wire 134C for the collector electrode pass through the base electrode contact 135S and the collector electrode contact 135C, respectively, and are connected to silicide layer 130 on the p+ type extrinsic base 129 and silicide layer 130 on the n+ type diffusion layer 127. The above-described ring-shaped structure 121 is formed in the area surrounding the bipolar transistor.

Next, the structure of the CMOS transistor and capacitance parts of the BiCMOS structure according to the first embodiment of the present invention will be described, making reference to FIG. 1.

First, a CMOS structure according to the first embodiment of the present invention, as shown in FIG. 1, has a first p-type well region 104 and a first n-type well region 105 formed on a silicon substrate 101, a gate electrode 119 being formed, on an intervening gate oxide layer 106, on the surfaces of the first p-type well region 104 and first n-type well region 105. On the side wall of the gate electrode 119, a side wall insulation film 125 the same as formed on the side wall of the emitter electrode 114 described above is formed, and directly below the side wall insulation film 125, in an NMOS, an n-type LDD layer is formed, an n+ type source/drain 126 being formed on the surface of the first p-type well region 104 on the outside of the side wall insulation film 125. In the case of a PMOS, a p-type LDD layer is formed, and a p+ type source/drain 128 is formed on the surface of the first n-type well region 105 on the outside of the side wall insulation film 125, in the same manner, a silicide layer 130 being formed on the surfaces of the n+ type source/drain 126 and the p+ type source/drain 128.

Additionally, the structure of the capacitance part of the first embodiment of the present invention, as shown in FIG. 1, has a lower electrode 120 of the capacitance formed on the isolation oxide film 102 that is formed on the silicon substrate 101, and onto the above-noted lower electrode 120 is formed an upper electrode 115, with a oxide film therebetween. The silicide layer 130 is formed over part of the above-noted lower electrode 120 and above the surface of the upper electrode 115 of the capacitance.

Next, the method of manufacturing a BiCMOS structure according to the first embodiment of the present invention will be described, with reference being made to FIG. 3 through FIG. 5.

First, as shown in FIG. 3(a), onto a silicon substrate 101 of p-type conductivity, a known LOCOS isolation method or trench method or the like is used to form an isolation oxide film 102. Additionally, thermal oxidation is used to form a first oxide film 103.

Next, as shown in FIG. 3(b), the NMOS formation region is ion implanted with boron ions, using an energy of 350 keV and a dose amount of $5\times10^{13}$ cm$^{-2}$, and heat treating is done, so as to form a first p-type well region 104. A PMOS formation region and bipolar transistor collector formation region are ion implanted with phosphorus ions, using an energy of 700 kev and a dose amount of $5\times10^{13}$ cm$^{-2}$, and heat treating is done, so as to form a first n-type well region 105.

Next, as shown in FIG. 3(c), a gate electrode film 106 of 5 to 10 nm is formed on the surface of the silicon substrate 101, and a first polysilicon 107 is grown to 150 to 400 nm thereon. Then, using a first mask 108 as an etching mask, a known anisotropic etching method is used to remove part of the first polysilicon 107. Then, for example, boron or BF$_2$ ion implantation is done with an energy of 10 to 50 keV and a dose amount of $1\times10^{13}$ cm$^{-2}$ to $5\times10^{14}$ cm$^{-2}$, thereby forming a p-type intrinsic base region 109.

Next, after removing the photoresist mask 108, a fourth oxide film 110 is deposited to a film thickness of approximately 100 nm. Then, as shown in FIG. 3(d), photolithography and dry etching technologies are used to selectively remove the fourth oxide film 110 and the gate oxide film 106, thereby forming an emitter contact 111 and a collector contact 112, and a second polysilicon 113 of 150 to 400 nm is deposited with arsenic doping of $1\times 10^{18}$ cm$^{-2}$ to $1\times10^{21}$ cm$^{-2}$.

Next, as shown in FIG. 4(a), using a mask of photoresist or the like, a known method of anisotropic etching is used to form an emitter electrode 114 and an upper electrode 115 of the capacitance, after which the above-noted mask of photoresist or the like and the fourth oxide film 110 are used as a mask for forming a collector trench, with either continuous etching being performed under the same etching conditions or several steps being performed, thereby performing the etching of the first n-type well region 105, forming the collector trench 116, after which a known method is used to etch the oxide film, with the exception of under the emitter electrode 114 and the upper electrode 115 of the capacitance, and the part that is left remaining as the first side wall insulation film 117 on the side wall of the aperture part of the first polysilicon 107, Next, as shown in FIG. 4(b) a second mask 118 of photoresist or the like is used to perform etching by a known method, thereby forming the gate electrode 119, the lower electrode 120 of the capacitance, and the ring-shaped structure 121.

Next, as shown in FIG. 4(c), the second mask 118 is removed, and a mask of photoresist or the like is used to perform ion implantation, so as to form an n-type LDD layer 122 and a p-type LDD layer 123, after which a second oxide film 124 being deposited over the entire surface to a thickness of approximately 200 nm.

Next, as shown in FIG. 4(d), a known method of anisotropic etching is used to form onto the side walls of the gate electrode 119, the emitter electrode 114, the collector trench 116a, the upper electrode 115 of the capacitance, and the lower electrode 120 of the capacitance and onto the outer side wall of the ring-shaped structure 121 a side wall insulation film 125 that is formed from the second oxide film 124.

Next, as shown in FIG. 5(a), a mask of photoresist or the like is used to implant ions of phosphorus, arsenic, or the like, thereby forming an NMOS n+ type source/drain 126 and an nt type diffusion layer 127 at the bottom of the collector trench 116a, after which a mask of photoresist or the like is used to perform ion implantation of boron, $BF_2$ or the like, thereby forming a PMOS p+ type source/drain 128 and a p+ type extrinsic base 129.

Next, as shown in FIG. 5(b), using a metal such as titanium, cobalt, or nickel, the surfaces of the gate electrode 119, the emitter electrode 114, the lower electrode 120 of the capacitance, the upper electrode 115 of the capacitance, the ring-shaped structure 121, the n-type diffusion layer 127 at the bottom of the collector trench 116a, and n+ type source/drain 126, the p+ type source/drain 128 and the p+ type extrinsic base 129 are silicided, thereby forming the silicide layer 130.

As shown in FIG. 1, an interlayer insulation film 131 is deposited, this being formed by an oxide film (TEOS-$SiO_2$ film) and an 800 nm BPSG film, and RTA is performed at 1050° C. for 5 to 10 seconds, thereby forming an emitter diffusion layer 132, after which a contact hole is made, and a contact plug 133 is formed, with an intervening barrier metal, after which a metal wire 134 is formed.

The effect of the first embodiment of the present invention is that, by forming a bipolar transistor inside the ring of a ring-shaped structure 121 that is made of the same material as the gate electrode 119, that is, made of a first polysilicon 107, and using an insulation film that provides insulation between the emitter electrode. 114 and the p+ type intrinsic base region 109 only within the ring of the ring-shaped structure 121, the insulation film that forms the side wall insulation film 125 of the CMOS transistor and the insulation film between the bipolar transistor emitter electrode 114 and p-type intrinsic base region 109 are made as separate insulation films, thereby preventing variations in the thickness of the insulation film that makes up the CMOS side wall insulation film, which prevents the occurrence of variations in the CMOS characteristics. Upon experimenting with the first embodiment of the present invention, it was possible with regard to the drain voltage versus current characteristics of the CMOS, to reduce the variation in drain current from a range of 5 to 10 that was experienced in the past to a range of 1 to 5%.

Next, the second embodiment of the present invention will be described with reference being made to FIG. 6. FIG. 6 is a plan view and cross-sectional view that show the bipolar transistor part of a BiCMOS structure. FIG. 6(b) is a cross-sectional view obtained along the cutting line C–D that is shown in FIG. 6(a). In this case, because the CMOS and capacitance are the same as in the case of the first embodiment, these parts will not be explicitly described herein.

As shown in FIG. 6(b), the structure of a bipolar transistor according to the second embodiment of the present invention has a first n-type well region 205 on a silicon substrate 201, a intrinsic base region that is made up of a p-type intrinsic base region 209 and the p+type extrinsic base 229 being formed inside the n-type well region 205. The intrinsic base region and the collector plug 233 that is formed inside the collector trench 216 are separated by an isolation oxide film 202 that is formed on the surface of the first n-type well region 205. An emitter diffusion layer 232 is formed in the p-type intrinsic base region 209, and an emitter electrode 214 is connected to the emitter diffusion layer 232. A ring-shaped emitter electrode outer periphery part 218 is formed so as to overlap in connection with the ring-shaped structure 221, and on the side wall of the emitter electrode 214 is formed a side wall insulation film 225, and on the outside part of the side wall insulation film 225 on the side wall of the emitter electrode 214 is formed a p+ type extrinsic base 229 that is formed simultaneously with the implantation of the CMOS p+ type source/drain. Additionally, the collector contact has been formed in it, a collector trench so as to collide with the peak dopant concentration part within the above-noted n-type well region 205, an n+ type diffusion layer 227 being formed on the bottom of the above-noted collector trench, a silicide layer 230 being also formed on the surfaces of the p+ type extrinsic base 229, the emitter electrode 214, the emitter electrode outer periphery part 218, and the n+ type diffusion layer 227.

In the plan view of a bipolar transistor according to the second embodiment of the present invention, as shown in FIG. 6(a), in the region surrounding the bipolar transistor, a ring-shaped structure 221 exists, this being made from the same first polysilicon as used for the CMOS gate electrode 219, FIG. 7(C), and on the top of this ring-shaped structure 221 is the outer periphery part 218 of the ring-shaped emitter electrode, these being in mutual connection via the second emitter contact 211a FIG. 7(c).

As shown in FIG. 6(a), the metal wire 234E for the emitter electrode is connected to the silicide layer 230 on the emitter electrode 214 via the contact 235E for the emitter electrode. In the same manner, the metal wire 234B for the base electrode and the metal wire 234C for the collector electrode are connected, via the contact 235B for the base electrode and the contact 235C for the collector electrode, to silicide layer 230 of the p+ type extrinsic base 229 and the silicide layer 230 on the n+type diffusion layer 227, respectively.

With the bipolar transistor of the BiCMOS structure according to the second embodiment of the present invention, as shown in FIG. 6(a), part of the emitter electrode wiring is in the shape of a ring, this enabling a large width to be established for the emitter electrode periphery part 218, thereby enabling suppression of an increase in the wiring resistance of the emitter electrode.

Next, a method of manufacturing a BICMOS structure according to the second embodiment of the present invention will be described, with reference being made to FIG. 7 and FIG. 8. As shown in FIG. 7(a), an isolation oxide film 202 is formed on a silicon substrate. 201 having p-type conductivity. Then, as describe with regard to the first embodiment, boron ions are implanted into the NMOS formation region so as to form a first p-type well region 204, and phosphorus ions are implanted into the PMOS formation region and bipolar transistor collector region, thereby forming a first n-type well region 205. A gate oxide film 206 of 5 to 10 nm is formed on the surface of the silicon substrate 201, a first polysilicon 207 of 150 to 400 is grown and, as described with regard to the first embodiment, a known etching method is used to remove part of this first polysilicon 207. Then, for example, boron or $BF_2$, ion implantation is done with an energy of 10 to 50 keV and a dose amount of $1\times10^{15}$ to $5\times10^{14}$ cm$^{-2}$, thereby forming a p-type intrinsic base region 209.

Then, a fourth oxide film 210 is deposited to a film thickness of approximately 100 nm, this fourth oxide film 210 and the gate oxide film 206 being selectively removed to form an emitter contact 211 and a collector contact 212, and a second polysilicon 213 of 150 to 400 nm being deposited with a doping of arsenic of $1\times10^{18}$ to $1\times10^{21}$ cm$^{-2}$.

Next, as shown in FIG. 7(b), using a mask of hotoresist or the like, a known anisotropic etching method is used to form an emitter electrode 214, an upper electrode 215 of the capacitance and an emitter electrode outer peripheral part 218, after which the above mask of photoresist or the like and the oxide film 210 are used as a collector trench forming mask, either etching being continued under the same etching conditions or several separated steps being performed, so as to perform etching of the first n-type well 205, thereby forming the collector trench 216. Next, a known method of anisotropic etching of an oxide film is used, with the exception of under the emitter electrode 214 and the upper electrode 215 of the capacitance, and the part that is left remaining as the first side wall insulation film 217 on the side wall of the aperture part of the first polysilicon 207.

Next, as shown in FIG. 7(c), a second mask 236 of photoresist or the like is used to performing etching by a known method, thereby forming the gate electrode 219, the lower electrode 220 of the capacitance, and the ring-shaped structure 221.

Next, as shown in FIG. 7(d), the second mask 236 is removed, and a mask of photoresist or the like is used to perform ion implantation, so as to form an n-type LDD layer 222 and a p-type LDD layer 223, and a second oxide film 224 being deposited over the entire surface to a thickness of approximately 200 nm.

Next, as shown in FIG. 8(a), a known method of anisotropic etching is used to form onto the side walls of the gate electrode 219, the emitter electrode 214, the collector trench 216, the upper electrode 215 of the capacitance, and the lower electrode 220 of the capacitance and the outer side wall of the ring-shaped structure 221 a side wall insulation film 225 that is formed from the second oxide film 224.

Next, as shown in FIG. 8(b), a mask of photoresist or the like is used to implant ions of phosphorus, arsenic, or the like, thereby forming an NMOS n+ type source/drain 226 and an n+ type diffusion layer 227 at the bottom of the collector trench 216a, after which a mask of photoresist or the like is used to perform ion implantation of boron, BF$_2$ or the like, thereby forming a PMOS p+ type source/drain 228 and a p+ type extrinsic base 229.

Next, as shown in FIG. 8(c), the surfaces of the gate electrode 219, the emitter electrode 214, the lower electrode 220 of the capacitance, the upper electrode 215 of the capacitance, the emitter electrode outer periphery part 218, the n-type diffusion layer 227 at the bottom of the collector trench 216a, and n+ type source/drain 226, the p+ type source/drain 228 and the p+ type extrinsic base 229 are silicided, thereby forming the silicide layer 130.

Next, as shown in FIG. 8(d), an interlayer insulation film 231 that is formed by an oxide film of, for example, 50 nm (TEOS-SiO$_2$ film) and an 800 nm BPSG film is formed, and RTA is performed for 10 seconds at 1050° C. or oven annealing is performed for 20 to 30 seconds at 900° C., thereby forming an emitter diffusion layer 232, after which a contact hole is made and a contact plug 323 is formed on an intervening barrier metal (not shown in the drawing), after which a metal wire 234 is formed.

In experimenting with the second embodiment of the present invention, for a bipolar transistor emitter length of 20 μm ( or greater, it was possible to achieve a reduction of approximately 30 to 60% in resistance that is attributed to the emitter electrode wiring resistance.

The third embodiment of the present invention is described below, with reference made to FIG. 9. FIG. 9 is a plan view and cross-sectional view of the bipolar transistor part of a BiCMOS structure according to the present invention. In general, the parts of this embodiment that differ from the second embodiment of the present invention will be described herein.

As shown in FIG. 9(a) and FIG. 9(b), an emitter electrode outer periphery part 218a is formed so as to be connected to the ring-shaped structure 221. The emitter electrode outer periphery part 218a is formed so as to have a wider wire width than in the second embodiment. The metal wire 234E for the emitter electrode is connected to the emitter electrode via the contact plug 233 at two locations on the emitter electrode outer periphery part 218a. For this reason, it is possible to achieve a further decrease in the wiring resistance of the emitter electrode. In experiments with the third embodiment of the present invention, it was possible to achieve a reduction in emitter resistance of approximately 30 to 40% in comparison with the second embodiment of the present invention.

With the present inventions in a semiconductor having both a bipolar transistor and an n-channel MOS transistor and a p-channel MOS transistor on one semiconductor substrate, a gate electrode of the above-noted MOS transistor is formed by patterning of a first conductive film, the emitter electrode of the bipolar transistor is formed by patterning of a second conductive film, and also a ring-shaped structure is formed so as to surround the bipolar transistor, this being formed by patterning of the first conductive film. Another effect is that the emitter electrode outer periphery part that is electrically connected to the above-noted ring-shaped structure is formed by the patterning of the second conductive film.

Additionally, a side wall insulation film is formed from the same insulation film on the above-noted gate electrode and emitter electrode.

For this reason, not only is the construction of the BiCMOS structure simplified, but also part of the emitter electrode, that is, the emitter electrode outer periphery part about the ring-shaped structure is disposed in a ring-shaped manner, so that these elements are in mutual connection, the result being that it is possible to prevent an increase in the wiring resistance of the emitter, even with a shrinking of the feature size of the BiCMOS structure.

Additionally, the insulation film that provides insulation between the emitter electrode of the bipolar transistor and the p-type intrinsic base region and the insulation film that makes up the side wall insulation film on the CMOS transistor gate electrode side wall and bipolar transistor emitter electrode side wall insulation are different insulation films. For this reason, it possible to form a BiCMOS structure having a high reliability.

What is claimed is:

1. A semiconductor device comprising:
   a bipolar transistor having an emitter electrode;
   a ring-shaped conductive layer which surrounds said bipolar transistor; and
   MOS transistors formed on a substrate with said bipolar transistor,
   wherein side walls of gate electrodes of said MOS transistors and side walls of said emitter electrode are formed of a same insulating film.

2. The semiconductor device according to claim 1, wherein a silicide layer is formed on the surfaces of source/drain diffusion region, and a gate electrode of said MOS transistor, said emitter electrode, and an emitter electrode outer periphery part formed on said ring-shaped conductive layer, and said emitter electrode outer periphery part on said ring shaped conductive layer is connected to said emitter electrode.

3. The semiconductor device according to claim 1, wherein said ring-shaped conductive layer is formed of a same material as said gate electrodes of said MOS transistors.

4. The semiconductor device according to claim 1, wherein said bipolar transistor comprises an insulation film that provides insulation between said emitter electrode and a base region only within said ring-shaped conductive layer.

5. The semiconductor device according to claim 1, wherein an insulation film that forms said side walls of said MOS transistors and an insulation film that provides insulation between said emitter electrode and a base region are formed of different insulation films.

6. The semiconductor device according to claim 1, wherein a variation of a drain current of said MOS transistors is between 1 and 5 percent.

7. The semiconductor device according to claim 1, wherein said emitter electrode has an outer periphery part which is formed over said ring-shaped conductive layer.

* * * * *